(12) United States Patent
Ma et al.

(10) Patent No.: US 7,449,909 B2
(45) Date of Patent: Nov. 11, 2008

(54) SYSTEM AND METHOD FOR TESTING ONE OR MORE DIES ON A SEMICONDUCTOR WAFER

(75) Inventors: David SuitWai Ma, Cary, NC (US); Tao Wang, Cary, NC (US); James J. Dietz, Durham, NC (US); Bing Ren, Cary, NC (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/707,408

(22) Filed: Feb. 16, 2007

(65) Prior Publication Data

US 2007/0152700 A1    Jul. 5, 2007

Related U.S. Application Data

(60) Continuation of application No. 11/386,512, filed on Mar. 22, 2006, now Pat. No. 7,242,208, which is a division of application No. 10/243,544, filed on Sep. 12, 2002, now Pat. No. 7,119,567.

(51) Int. Cl.
*G01R 31/26* (2006.01)
*G01R 31/02* (2006.01)
*G01R 31/28* (2006.01)

(52) U.S. Cl. .................... 324/763; 324/765; 324/158.1; 257/48; 438/18; 714/736

(58) Field of Classification Search ......... 324/754–765, 324/753, 158.1; 257/48; 438/18; 714/736
See application file for complete search history.

(56) References Cited

U.S. PATENT DOCUMENTS

| 4,139,818 | A | 2/1979 | Schneider |
| 4,340,857 | A | 7/1982 | Fasang |
| 4,956,602 | A | 9/1990 | Parrish |
| 5,053,700 | A | 10/1991 | Parrish |
| 5,279,975 | A | 1/1994 | Devereaux et al. |
| 5,483,175 | A | 1/1996 | Ahmad et al. |

(Continued)

FOREIGN PATENT DOCUMENTS

JP    2001-221-833    8/2001

OTHER PUBLICATIONS

Gerner, M.; Muller, B; Sandweg, G.; Selbsttest digitaler Schaltungen. Munchen [u.a.]; Oldenbourg, 1990, Seiten 56-59, 100-101, 120-124, 131-135, 140-151, 153-156; ISBN 3-486-21765-8.

(Continued)

*Primary Examiner*—Ha Nguyen
*Assistant Examiner*—Emily Y Chan
(74) *Attorney, Agent, or Firm*—Brinks Hofer Gilson & Lione

(57) ABSTRACT

A testing system or method compares read data from one or more dies in a semiconductor wafer with the original data written onto the one or more dies. The testing system includes one or more write registers connected to one or more dies on the semiconductor wafer. One or more comparators are connected to the dies and the write registers. The comparator generates a result in response to the original data and the read data.

6 Claims, 4 Drawing Sheets

U.S. PATENT DOCUMENTS

| | | | |
|---|---|---|---|
| 5,720,031 A * | 2/1998 | Lindsay | 714/42 |
| 5,899,703 A | 5/1999 | Kalter et al. | |
| 6,046,600 A | 4/2000 | Whetsel | |
| 6,166,557 A | 12/2000 | Whetsel | |
| 6,233,184 B1 | 5/2001 | Barth et al. | |
| 6,452,411 B1 | 9/2002 | Miller et al. | |
| 7,173,444 B2 * | 2/2007 | Pourkeramati et al. | 324/765 |
| 2002/0021140 A1 | 2/2002 | Whetsel | |

OTHER PUBLICATIONS

Keeth, Brent, et al., "DRAM Circuit Design: A Tutorial," IEEE Press Series On Microelectronic Systems, 24 pages.

* cited by examiner

| SERIAL DATA OUT | 1 | 1 | 1 | 0 | 1 | 1 | 1 | 1 | 0 | 1 | 0 | 0 | 0 | 0 | 1 | 0 | 0 | 0 | 1 | 1 | 1 | 1 |
|---|---|---|---|---|---|---|---|---|---|---|---|---|---|---|---|---|---|---|---|---|---|---|
| DIE NO. | 1 | | | | 2 | | | | 3 | | | | 4 | | 5 | | | | 6 | | | |
| DIE F/P | F | | | | P | | | | F | | | | F | | F | | | | P | | | |
| DQ GROUP NO. | 1 | 2 | 3 | 4 | 1 | 2 | 3 | 4 | 1 | 2 | 3 | 4 | 1 | 2 | 3 | 4 | 1 | 2 | 3 | 4 | | |
| DQ GROUP F/P | P | P | P | F | P | P | P | F | F | P | F | F | P | F | F | F | F | F | F | F | P | P | P | P |

FIG. 4

SYSTEM AND METHOD FOR TESTING ONE OR MORE DIES ON A SEMICONDUCTOR WAFER

RELATED APPLICATIONS

The present application is a continuation of U.S. patent application Ser. No. 11/386,512 filed on Mar. 22, 2006, now U.S. Pat. No. 7,242,208, which is a division of U.S. application Ser. No. 10/243,544, filed Sep. 12, 2002, now U.S. Pat. No. 7,119,567.

The following copending and commonly assigned U.S. patent applications have been filed on the same day as related application Ser. No. 10/243,544. All of these applications relate to and further describe other aspects of this application and are incorporated by reference in their entirety. U.S. patent application Ser. No. 10/242,894, entitled "SEMICONDUCTOR WAFER TESTING SYSTEM," filed on Sep. 12, 2002, and now U.S. Pat. No. 6,888,365; U.S. patent application Ser. No. 10/243,363, entitled "DIE ISOLATION SYSTEM FOR SEMICONDUCTOR WAFER TESTING," filed on Sep. 12, 2002.

FIELD

This invention generally relates to methods and devices for testing dies on semiconductor wafers. More particularly, this invention relates to methods and devices having circuitry and routing mechanisms in the kerf area for testing dies on a semiconductor wafer.

BACKGROUND

Integrated circuits (ICs) typically begin fabrication as a die on a flat, circular substrate or wafer. The die comprises a rectangular portion of the wafer surface and is also known as a chip, circuit, or the like. Each wafer usually is segmented by scribe or saw lines into multiple dies, which typically form essentially identical rectangular circuit patterns. Some dies may be engineering or test dies. Other dies may be edge dies where the wafer does not permit the formation of a complete die along the edge of the wafer. On many wafers, there is a kerf area or area between the dies. The size of the kerf area varies as the number and arrangement of the dies on the wafer varies. When fabrication is completed, the wafer is cut along the saw lines to separate the dies for use in IC devices.

Dies are tested after fabrication to determine whether a suitable IC has been manufactured. The dies may be individually tested after separation of the wafer. The dies also may be serially tested before separation of the wafer. Die testing usually involves the use of mechanical probes from a testing device. The mechanical probes engage test pads or pins on the die. Once engaged, the testing device applies input signals or voltages to the die then receives output signals or voltages from the die.

Generally, the testing device needs to have at least the same number of data tester channels as the number of data pins on the die. If a die has eight data pins, then eight data tester channels usually are connected to the eight data pins on the die for reading and writing data. The maximum number of dies that can be tested at the same time is equal to the total number of data tester channels divided by the number of data pins per die.

BRIEF SUMMARY

This invention provides a testing system or method for comparing read data from one or more dies on a semiconductor wafer with the original data written onto the one or more dies. The testing system uses the comparison of the read data with the write data to determine whether the die passes or fails. In one aspect, the testing system includes a die on a semiconductor wafer, a write register, and a comparator. The write register is connected to the die and writes original data onto the die. The comparator is connected to the die and the write register. The comparator receives read data from the die and receives original data from the write register. The comparator generates a result in response to the original data and the read data.

In another aspect, the testing system includes one or more dies on a semiconductor wafer, a selector block, one or more write registers, one or more comparators, a shift register, and an error detection circuit. The selector block is connected to the one or more dies and to the one or more write registers. The selector block writes original data from the one or more write registers onto the one or more dies in response to a select signal. The one or more comparators are connected to the one or more dies and the one or more write registers. The one or more comparators receive read data from the one or more dies and receive original data from the one or more write registers. The one or more comparators generate one or more results in response to the original data and the read data. The shift register is connected to receive the one or more results from the one or more comparators. The shift signal generates serial data in response to the one or more results. The error detection circuit is connected to receive the one or more results from the shift register. The error detection circuit may generate an error signal in response to the one or more results.

In a method for testing dies on a semiconductor wafer, an original data word is written onto one or more dies. A read data word is read from the one or more dies. A result is generated in response to the read data word and the original data word.

Other systems, methods, features, and advantages of the invention will be or will become apparent to one skilled in the art upon examination of the following figures and detailed description. All such additional systems, methods, features, and advantages are intended to be included within this description, within the scope of the invention, and protected by the accompanying claims.

BRIEF DESCRIPTION OF THE DRAWINGS

The invention may be better understood with reference to the following figures and detailed description. The components in the figures are not necessarily to scale, emphasis being placed upon illustrating the principles of the invention. Moreover, like reference numerals in the figures designate corresponding parts throughout the different views.

FIG. 4 is a chart illustrating an example of the serial data output from a shift register according to the embodiment in FIG. 3.

DETAILED DESCRIPTION OF THE PRESENTLY PREFERRED EMBODIMENTS

Figure 1:
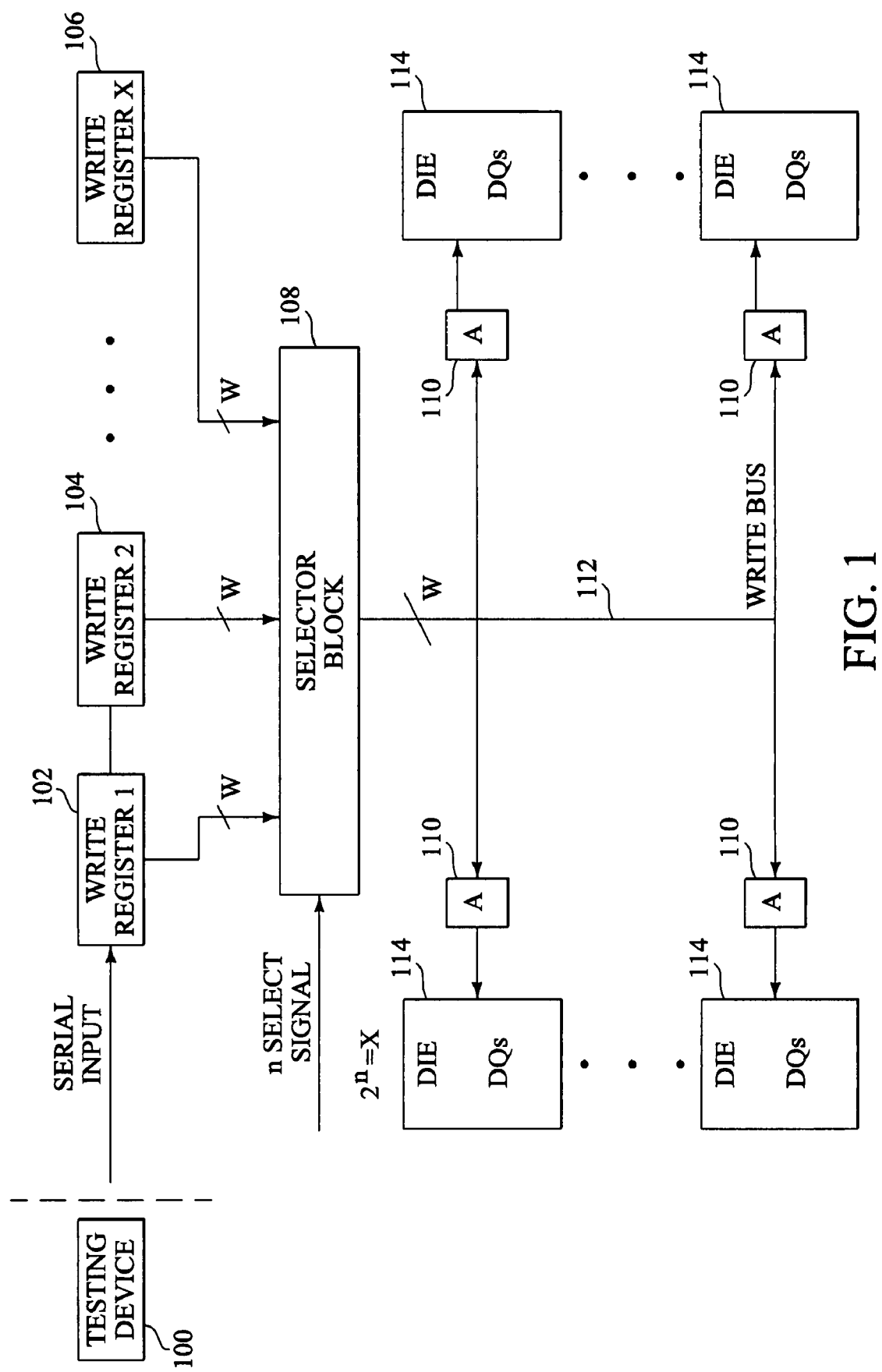
FIG. 1 represents a block diagram or flow chart of a write segment for a system or method to test dies on a semiconductor wafer according to an embodiment.
Figure 2:
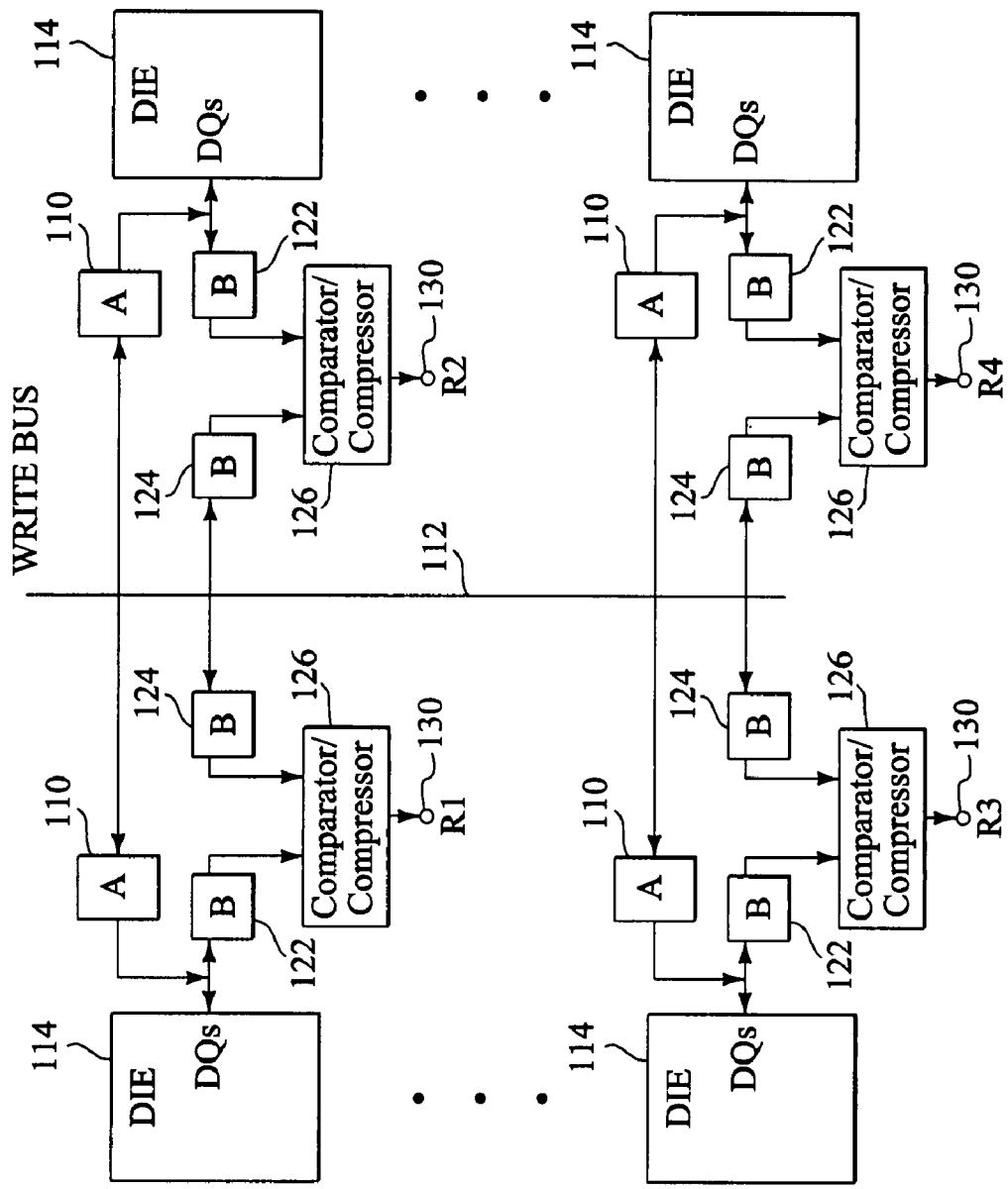
FIG. 2 represents a block diagram or flow chart of a read segment for a system or method to test dies on a semiconductor wafer according to the embodiment in FIG. 1.

FIGS. 1 and 2 represent block diagrams or flow charts of a testing system or method for dies on a semiconductor wafer according to an embodiment. The testing system writes data onto part or all of the array in one or more dies of the semiconductor wafer. The testing system reads the data from the die and compares the read data with the original data written onto the array. If the read data is substantially the same as the original or write data, then that portion of the array on the particular die is deemed to have passed the test or have acceptable quality. If the read data is not substantially the same as the original or write data, then that portion of the array on the particular die is deemed to have failed the test or have unacceptable quality. The testing system performs parallel testing in which the same data is written onto the same portion of the array in each die at essentially the same time. Other testing methods may be used.

FIG. 1 represents a block diagram or flow chart of the write segment of the testing system. FIG. 2 represents a block diagram or flow chart of the read segment of the testing system along with a portion of the write system shown in FIG. 1. The testing system uses circuitry and routing mechanisms added to the kerf area or another portion of the semiconductor wafer. Once the testing is completed, the kerf area is cut away from the die. The testing system is used with a testing device (not shown), which provides input signals and receives output signals from the testing system. The testing device has one or more test pins (not shown) that engage test pads (not shown) on the semiconductor wafer. The testing system may include a computer or other microprocessor device for performing the test and storing the results. The circuitry and routing may be completely on the wafer. The circuitry and routing mechanism may be partially on the wafer and partially on the testing device. While specific configurations are shown, other configurations may be used including those with fewer or additional components.

Referring to FIG. 1, the write segment of the test system comprises one or more write registers 102, 104, and 106 connected to the selector block 108. The write registers 102, 104, and 106 are connected to receive a serial input signal from a serial test pin (not shown). Selector block 108 is connected to receive a select signal from a selector test pin (now shown). The testing device provides the serial input and selects signals when engaged to the test pins. Selector block 108 also is connected to one or more write tristateable buffers 110 via a write bus 112. Each write tristateable buffer 110 is connected to a die 114. The one or more dies 114 collectively form part or all of a semiconductor wafer. The dies 114 may be arranged as one or more die clusters on the wafer. Each write tristateable buffer 110 also has a control test pin (not shown) for receiving a write control signal from the testing device. In one aspect, the control test pins may be interconnected to receive the write control test signal from the testing device through one test pin. In one aspect, write bus 112 has the same data width as the number of DQ pins in one die. There may be multiple write buses corresponding to the number of die clusters on the semiconductor wafer.

Referring to FIG. 2, a portion of the write segment from FIG. 1 is shown including write bus 112, write tristateable buffers 110, and dies 114. The read segment of the test system comprises one or more pairs of read tristateable buffers 122 and 124 connected to one or more comparators or compressors 126. Each pair comprises a device read tristateable buffer 122 and a bus read tristateable buffer 124. Each device read tristateable buffers 122 is connected to the die 114 and the comparator or compressor 126. Each bus read tristateable buffer 124 also is connected to the write bus 112 and the comparator or compressor 126. Each read tristateable buffer 122 and 124 has a control test pin (not shown) for receiving a read control signal from the testing device. The control test pins for the read tristateable buffers 122 and 124 may be interconnected to receive the read control signals from the testing device through one test pin. There maybe multiple control test pins for the read tristateable buffers 122 and 124. In one aspect, each comparator or compressor 126 has an output test pin for providing an output signal the testing device. The output test pins may be interconnected to provide the output signals through one test pin to the testing device. In another aspect, each comparator or compressor 126 is connected to a shift register or other data storage/processing device as described below.

In operation, the testing device engages the test pins on the semiconductor wafer. During an initialization state or period, the testing device provides or writes the serial input signal to write registers 102, 104, and 106, which hold their respective portions of the serial input signal or data test words. In one aspect, the testing device provides all the data test words through one serial input pin.

During a write state or period, data from one or more of the write registers 102, 104, and 106 are written onto a portion of the array in each of the dies 114. The selector block 108 sends or writes one or more data words from one or more of the write registers 102, 104, and 106 onto the dies 114 via the write bus 112 in response to the select signal from the testing device. The select signal determines or selects one of the write registers 102, 104, and 106 to provide the same data word to each of N the dies 114. There are N signals, ($2 \cdot \sup \cdot N = x$, where N is the number of bits and x is the number of the write register or data word to use). The write register may change during a write sequence so that a data word is written from one write register and then another data word is written from another write register. The testing device sends a write control signal during the write state that enables the write tristateable buffers 110 to electrically connect the bus 112 to the dies 114. The testing device also sends another control signal that turns the read tristateable buffers 122 and 124 into Hi-Z state, thus isolating the read segment from the bus 112 and dies 114.

During a read state or period, the data word on each die 114 is read and compared with the data word in the selected write register 102, 104, and 106. The testing device sends a read control signal that enables the read tristateable buffers 122 and 124 to connect electrically the dies 114 and the write bus 112. The testing device also sends another control signal that turns the write tristateable buffers 110 into Hi-Z state, thus isolating the bus 112 and hence the write registers from the dies 114.

The comparator or compressor 126 compares the read data from the die 114 with the expected data from the selected write register 102, 104, and 106. The comparison result or output signal R is provided to the testing device or further processed. The result R may be compressed to one or more bits with respect to data typology information and test needs. In one aspect, the result R is compressed to one bit, reflecting pass or failure. After the result R is obtained, the testing device repeats the write-read-comparison cycle according to the testing parameters. There may be one or more cycles. Each cycle may use the same or different data words for the same or different write registers 102, 104, and 106.

The testing system may be used to reduce the number of test or data pins from the testing device to the semiconductor wafer. The following examples illustrate the reduction in data pins. Other reductions may be obtained depending upon the number of test channels for each die, the number of dies, the bits of the comparator result, the number of selection signal and control signal inputs, and/or like factors of the semiconductor wafer and testing device.

EXAMPLE 1

| | |
|---|---|
| Tester Channels Needed for Each Die = | 16 |
| Number of Dies = | 4 |
| Bits of Comparator Results = | 4 |
| Number of Selection and Control Signal Inputs = | 5 |

Data Pin Reduction=(Number of Data Pins Without Testing System)−(Number of Data Pins With Testing System)
Data Pin Reduction=[4*(16−4)]−[5]
Data Pin Reduction=43

EXAMPLE 2

| | |
|---|---|
| Tester Channels Needed for Each Die = | 16 |
| Number of Dies = | 6 |
| Bits of Comparator Results = | 4 |
| Number of Selection and Control Signal Inputs = | 3 |

Data Pin Reduction=(Number of Data Pins Without Testing System)−(Number of Data Pins With Testing System)
Data Pin Reduction=[6*(16−4)]−[3]
Data Pin Reduction=69

Figure 3:
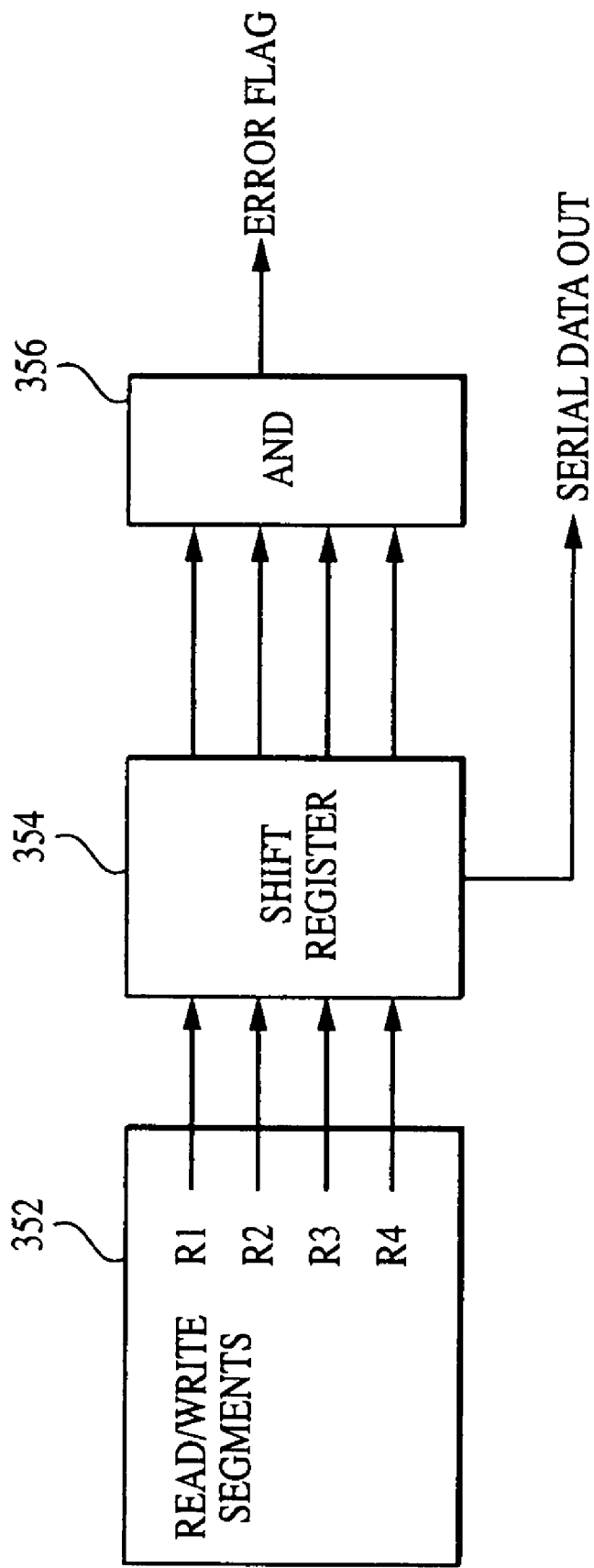
FIG. 3 represents a block diagram or flow chart of a system or method for testing dies on a semiconductor wafer according to another embodiment.

FIG. 3 represents a block diagram or flow chart of a system or method for testing dies on a semiconductor wafer according to another embodiment. This testing system comprises read/write segments 352, a shift register 354, and a "AND" gate 356. The read/write segments 352 are substantially the same and operate substantially the same as the read and write segments previously described in relation to FIGS. 1 and 2, except that the results R from the comparators or compressors 126 are provided to shift register 354. The shift register 354 and the AND gate 356 may be provided on the kerf area or other portion of the semiconductor wafer. The shift registers 354 or the AND gate 356 may instead be provided on the testing device.

In operation, the data coming out from the read/write segments 352 (the results R from the comparators or compressors 126 in FIG. 2) are entered into the shift register 354 and then are fed or transposed into the AND gate 356. The shift register 354 also provides serial data out as described below. If any one of the results R is 0 (where 0 indicates failing), the AND gate 356 outputs an error flag. The AND gate 356 may be another error detection circuit such as an OR gate, a logic gate, a wired gate, and the like. When the error detection circuit is an OR gate, the OR gate outputs an error flag if any one of the results R is 1 (where 1 indicates failing).

FIG. 4 is a chart illustrating an example of the serial data output from the shift register 354. The serial data out is shown in relation to the die and DQ group numbers and their test results. Other serial data outputs may be obtained including those with different pass or fail indications. For each write-read-comparison cycle, the shift register 354 shifts out the data string at the frequency of N times the test or cycle frequency, where N is the number of bits of the shift register. The data string is used to find or determine the die that failed. Four data bits represent the DQs from each die that are generated per address after comparison and compression. If a die cluster has six dies, then 24 bits will be generated per cycle. These data bits are latched in parallel to the shift register. In one aspect, the shift register is clocked at 24 times the test frequency, so that during one write-read-comparison cycle, the 24-bit string is read from the serial data output. The frequency of clocking the serial data out may be higher or lower. The frequency of clocking may be lower by reading at a slower rate or by adding pause cycles. The error flag is set to 0 if any of these 24 data bits is 0. Each die corresponds to four data bits in the string. If one of these four bits failed, then the die failed for that read address. When an error is detected as indicated by the error flag, a failed die may be found or determined by the 0's in the serial data output. In addition, the particular DQ group that failed may be identified. The 24 data channels from the read segment in FIG. 2 are reduced to two test channels. The total number of saved channels within each die cluster is about 91 depending upon the number of channels used to implement control signals. In one aspect, the number of channels for the control signals is in the range of about 3-5 channels.

Various embodiments of the invention have been described and illustrated. However, the description and illustrations are by way of example only. Other embodiments and implementations are possible within the scope of this invention and will be apparent to those of ordinary skill in the art. Therefore, the invention is not limited to the specific details, representative embodiments, and illustrated examples in this description. Accordingly, the invention is not to be restricted except in light as necessitated by the accompanying claims and their equivalents.

The invention claimed is:

1. A method for testing dies on a semiconductor wafer;
   writing a serial input signal from a testing device external to the semiconductor wafer into a write register on the semiconductor wafer;
   writing an original data word having a data width from the write register onto at least one die, wherein the data width corresponds to a number of data pins of the at least one die;
   reading a read data word from the at least one die;
   comparing, on the semiconductor wafer, the read data word with the original data word in the write register; and
   generating, on the semiconductor wafer, at least one result in response to the step of comparing; and
   transmitting the at least one result to the testing device external to the semiconductor wafer.

2. The method according to claim 1, further comprising: writing the original data word onto a portion of the die; and reading the read data word from the portion of the die.

3. The method according to claim 1, further comprising: entering the at least one result into a shift register; and transposing the at least one result from the shift register to an error detection circuit.

4. The method according to claim 3, where the error detection circuit comprises an AND gate.

5. The method according to claim 1, further comprising, on the semiconductor wafer, generating at least one of an error flag and serial data as the at least one result.

6. The method according to claim 5, further comprising finding a failed die based on the serial data when an error is detected as indicated by the error flag.

* * * * *